(12) United States Patent
Azmoodeh

(10) Patent No.: US 7,180,347 B2
(45) Date of Patent: *Feb. 20, 2007

(54) SYSTEMS AND METHODS FOR MINIMIZING HARMONIC INTERFERENCE

(76) Inventor: Masoud Azmoodeh, 322 Oak Glen, Irvine, CA (US) 92618

( * ) Notice: Subject to any disclaimer, the term of this patent is extended or adjusted under 35 U.S.C. 154(b) by 0 days.

This patent is subject to a terminal disclaimer.

(21) Appl. No.: 11/297,183

(22) Filed: Dec. 6, 2005

(65) Prior Publication Data

US 2006/0181321 A1    Aug. 17, 2006

Related U.S. Application Data

(63) Continuation of application No. 09/973,608, filed on Oct. 9, 2001, now Pat. No. 7,091,762.

(51) Int. Cl.
*H03K 3/017* (2006.01)
(52) U.S. Cl. .............. 327/175; 327/173; 327/174; 327/35
(58) Field of Classification Search ........... None
See application file for complete search history.

(56) References Cited

U.S. PATENT DOCUMENTS

| | | | |
|---|---|---|---|
| 3,868,677 A | 2/1975 | Kidd | 340/347 AD |
| 4,085,373 A | 4/1978 | McConnell | 328/141 |
| 4,672,643 A | 6/1987 | Sweet | 377/47 |
| 4,733,197 A | 3/1988 | Chow | 331/1 A |
| 5,133,064 A | 7/1992 | Hotta et al. | 713/375 |
| 5,245,520 A | 9/1993 | Imbertson | 363/17 |
| 5,337,022 A * | 8/1994 | Pritchett | 331/1 A |
| 5,365,119 A | 11/1994 | Kivari | 327/115 |
| 5,481,560 A * | 1/1996 | Potetz et al. | 375/238 |
| 5,757,218 A | 5/1998 | Blum | 327/175 |
| 5,959,850 A | 9/1999 | Lim | 363/17 |
| 6,052,152 A * | 4/2000 | Malcolm et al. | 348/537 |
| 6,310,922 B1 | 10/2001 | Canfield et al. | 375/240.28 |

* cited by examiner

*Primary Examiner*—Timothy P. Callahan
*Assistant Examiner*—An T. Luu

(57) ABSTRACT

Systems and methods are disclosed for minimizing nth-order harmonic associated with a square wave clock signal having a predetermined frequency and duty cycle. The system changes the duty cycle of the clock to eliminate or suppress the nth-order harmonic of the clock; and generates a low-interference clock having the changed duty cycle while keeping the predetermined frequency.

19 Claims, 5 Drawing Sheets

SYSTEMS AND METHODS FOR MINIMIZING HARMONIC INTERFERENCE

This application is a continuation of U.S. patent application Ser. No. 09/973,608, which was filed on Oct. 9, 2001, now U.S. Pat. No. 7,091,762, entitled "SYSTEMS AND METHODS FOR MINIMIZING HARMONIC INTERFERENCE", the disclosure of which is hereby incorporated by reference in its entirety.

BACKGROUND

This invention relates to systems and methods for minimizing harmonic in a communications circuit.

Frequency conversion is the process of changing one frequency to another. This may occur in instances when one signal is multiplied with a second signal to producea sum and/or difference of the signals. Frequency conversion circuits are commonly used in transmitters/receivers to convert an outgoing/incoming Intermediate Frequency/Radio Frequency (IF/RF) signal to the RF/IF signal. In case of receivers the IF signal is further processed by circuits following the frequency conversion circuit to develop a suitable signal for passing to a demodulator. The demodulator recovers the information encoded into the IF signal. The frequency conversion circuit produces the IF signal by mixing the RF signal with one or more local oscillator (LO) signals using a mixer.

Wireless receivers usually use several mixers to take the RF signal from the antenna and shift it to the lower IF frequency. This procedure usually will help on sampling the data and going to the digital domain. The frequency of the IF signal will be determined by the separation in frequency between the radio frequency signal and the local oscillator signals. The mixer receives separate input signals and combines the signals to produce an output signal. The mixer allows very high frequency to be down-converted to baseband or IF so that signals may be evaluated using analog or digital signal processing techniques. In another example, the mixer up-converts a low frequency to a high frequency.

Potential detrimental interference can arise in the IF circuit. One form of detrimental interference includes harmonic interference, also referred to as "harmonic". Harmonics are generally spectral components of a signal that can interfere with proper operation of the wireless receiver. These digital transceiver ICs typically deploy many clocks in the same IC running at different frequencies. The problem becomes more pronounced for single chip digital RF transceivers since such single chip solution for wireless receivers requires combining the RF and Base Band processing. The effect of the harmonic of any of these clocks on the mixed signal part of the IC becomes significant. As an example of this problem, the third harmonic of a 1 MHz clock at the output of the last mixer appears as an IF signal at 3 MHz. This third harmonic of the 1 MHz clock will show up as a 3 MHz signal at the output of the IF mixer at 3 MHz and during the demodulation process this will look like a DC offset, which is undesirable.

SUMMARY

In one aspect, a method minimizes nth-order harmonic associated with a square wave clock signal having a predetermined frequency and a duty cycle by changing the duty cycle of the clock to eliminate or suppress the nth-order harmonic of the clock; and generating a low-interference clock having the changed duty cycle while keeping the predetermined frequency.

Implementations of the above aspect may include one or more of the following: Generating a low-interference clock further comprises generating an asymmetrical clock signal. Changing the duty cycle can change the position of the falling edge of the square wave clock relative to the position of the rising edge of the clock. Minimizing the nth order harmonic changes the magnitude of the other harmonic. The resulting low-interference clock can be used in digital transceivers.

In another aspect, a system for minimizing nth-order harmonic associated with a square wave clock signal having a predetermined frequency and a duty cycle includes means for changing the duty cycle of the clock to eliminate or suppress the nth-order harmonic of the clock; and means for generating a low-interference clock having the changed duty cycle while keeping the predetermined-frequency.

Implementations of the above aspect may include one or more of the following. The means for generating a low-interference clock further includes means for generating an asymmetrical clock signal. The means for changing the duty cycle further comprises means for changing the position of the falling edge of the square wave clock relative to the position of the rising edge of the clock. Minimizing of the nth-order harmonic changes the magnitude of other harmonic. The low-interference clock can be used in a digital radio transceiver.

In another aspect, a clock generator includes a clock oscillator; a down counter coupled to the clock oscillator; and a controller coupled to the down counter to generate a low harmonic clock with an asymmetrical duty cycle.

Implementations of the above aspect may include one or more of the following: The clock oscillator generates an output at a high frequency relative to the desirable low frequency clock rate. The counter is a modular down counter. The controller can change the position of the falling edge of the clock relative to the position of the rising edge of the clock. The controller can minimize the nth-order harmonic and change the magnitude of other harmonic.

Advantages of the above system and method may include one or more of the following. The system reduces nth-order harmonic to almost zero without requiring the use of higher grade components or employing additional shielding around noisy components (through, for example, a metal shield to enclose the noisy device). The system achieves higher performance in a cost-effective manner.

The above system provides a method for suppressing adverse harmonic of the signal. Changing the duty cycle of the digital clock reduces or eliminates various specific harmonics. Additionally, one or more design parameters can be modified to reduce or eliminate unwanted harmonics. The system reduces a specific signal interference problem on a chip and minimizes the effect of the harmonics of the clocks on a chip on other parts of the chip.

DESCRIPTION

Figure 1:
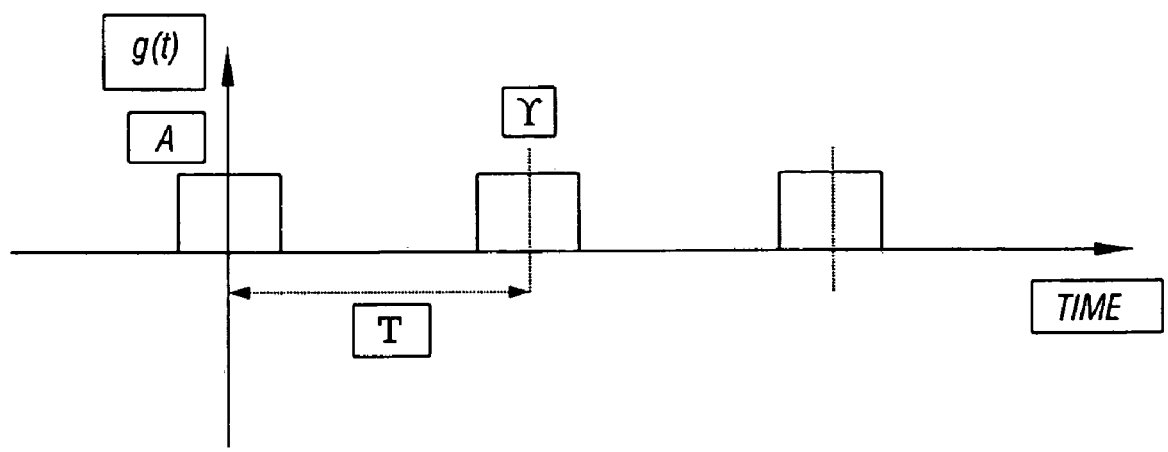
FIG. 1 shows an exemplary square wave signal.

FIG. 1 shows an exemplary square wave g(t) with period T and pulse width τ. The square wave can be described mathematically as follows:

$$g(t)=A, -\tau/2 \leq t \leq \tau/2 = 0,$$

For the remainder of the Period T.
g(t) can be expanded using the Fourier transform:

$$g(t) = \sum_{-\infty}^{\infty} C_n \exp(j2\pi nt/T), \text{ where}$$

$$C_n = 1/T \int_{-\tau/2}^{\tau/2} g(x)\exp(-j2\pi nt/T) dt$$

The integral for $C_n$ can be expressed as follows:

$$C_n = (A/n\pi)\sin(n\pi\tau/T), n=0, \pm1, \pm2, \ldots$$

As an example, for τ=T/2, (50—50 duty cycle), $|C_3|$ the magnitude of the third harmonic of the signal can be calculated as: $|C_3|=(A/3\pi)\sin(3.-\pi/2)=A/(3\pi)$ and for τ≠T/2, $|C_3|=(A/3-\pi)\sin(3\pi\tau/T)$,
where $|SIN(.)| \leq 1$.

Thus, for any value of τ≠T/2, the magnitude of the third harmonic is less than its value for a symmetric clock.

Using τ=T/3, $C_3=A/(3\tau)\sin(\tau)=0$ and the third harmonic can be minimized.

As discussed next, the effect of third harmonic of 1 MHz clock on the output of the IF mixer at 3 MHz is significantly reduced in one exemplary embodiment of the invention.

Figure 2:
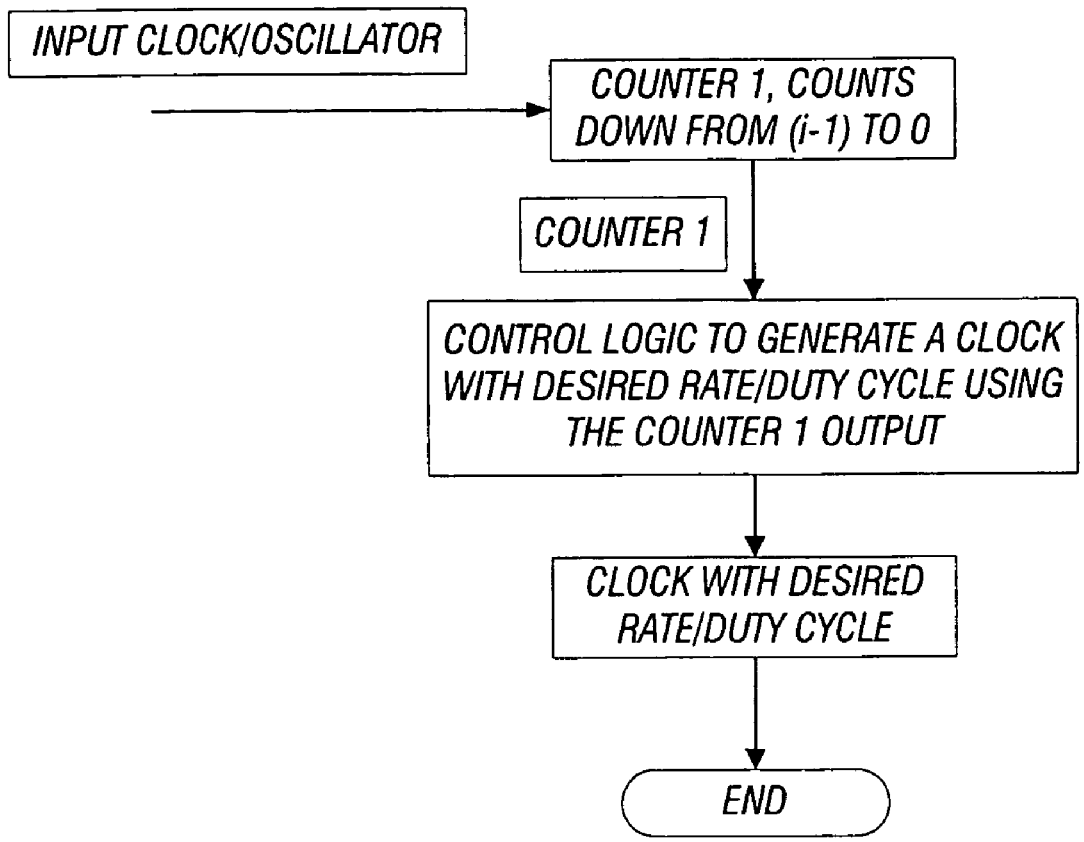
FIG. 2 shows an exemplary clock generator in accordance with the present invention.
Figure 4:
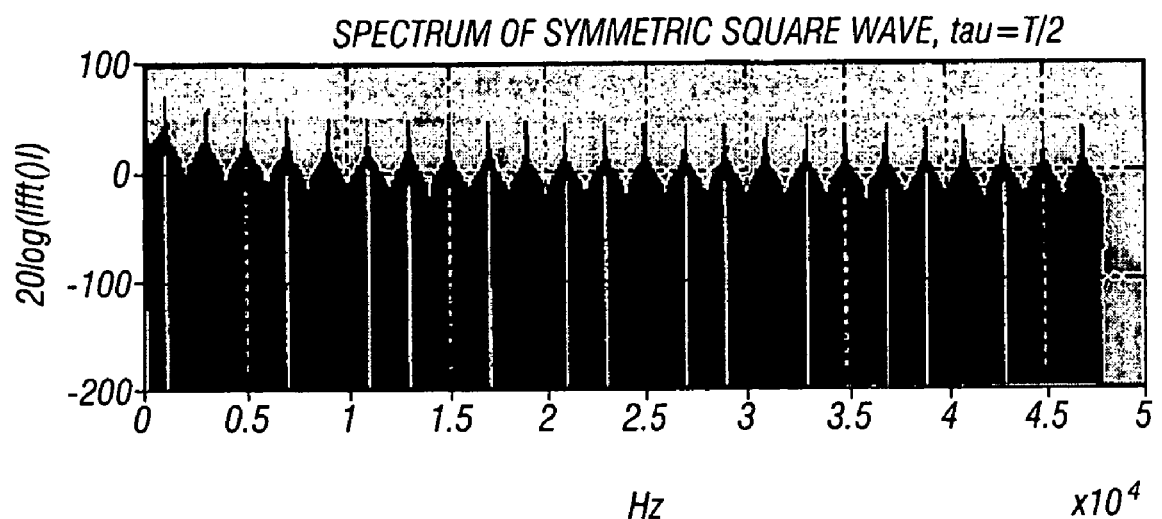
FIG. 4 shows power spectrum charts for a 1 KHz clock (symmetrical and asymmetrical).
Figure 4:
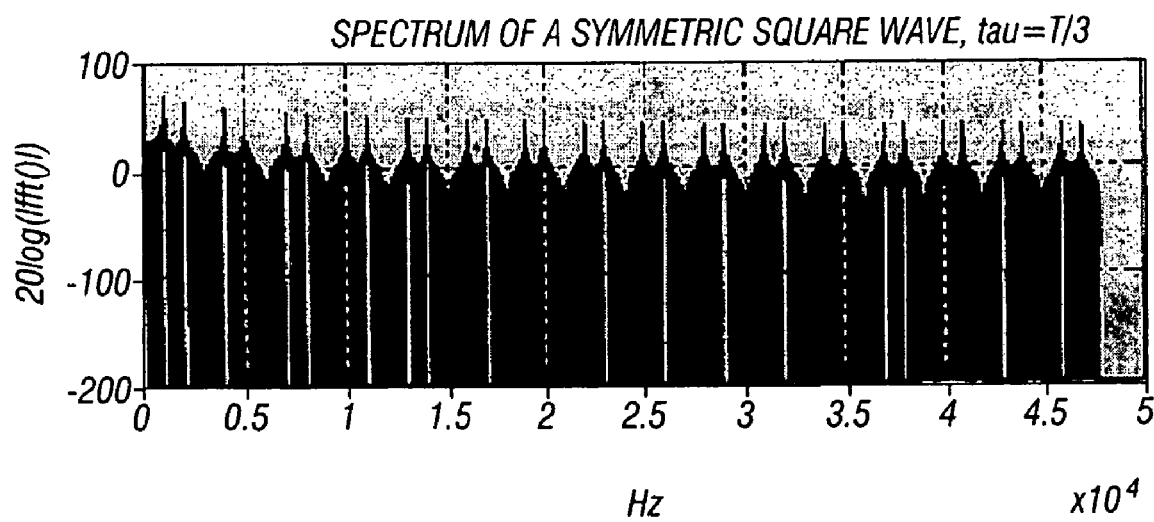
Figure 5:
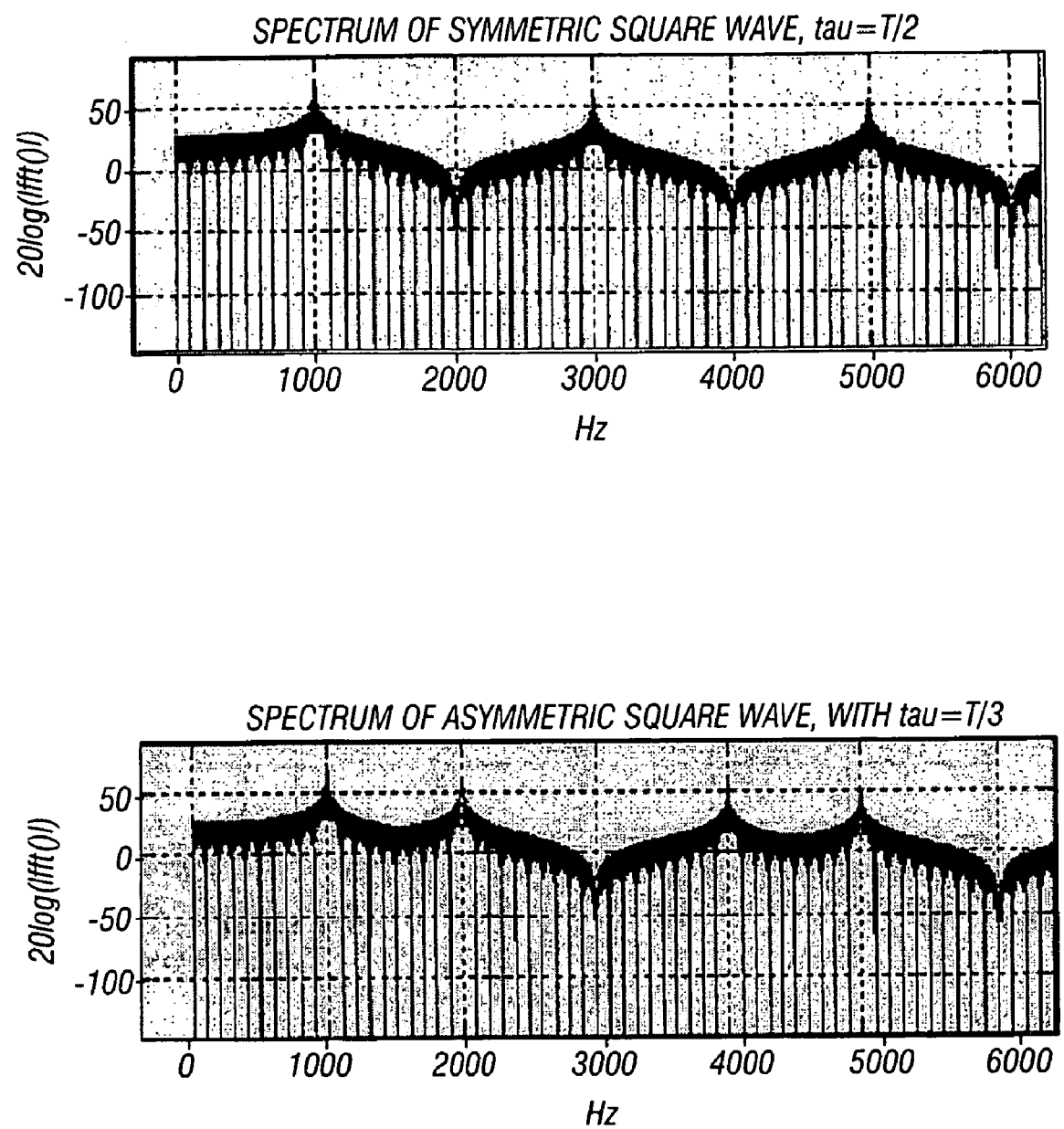
FIG. 5 shows power spectrum charts for the 1 KHz clock (symmetrical/asymmetrical).

FIG. 2 shows an exemplary clock generator. The system of FIG. 2 uses a relatively high frequency (in this example 24 kHz) clock/oscillator to generate an asymmetric low frequency clock (in this example a 1 KHz clock with 33/67 percent duty cycle). FIGS. 4–5 show the spectrum for both symmetric clock (50/50 percent duty cycle), and asymmetrical clock (33/67 percent duty cycle).

In the example of FIGS. 4–5, the clock generator is arbitrarily set for the 33/67 percent duty cycle. However, any other duty cycle percentage can be used. As an example for generating the 33/67 percent duty cycle 1 kHz clock as in FIG. 2, counter1 counts from (i−1) to 0, where i=24 for the embodiment of FIG. 2. Counter1 is a modular counter with modulo i and counts on the rising edge of the 24 KHz clock/oscillator.

During the system initialization (reset), control logic resets the counter1 to i. As long as 0<counter1≦(j−1) where j=8 control logic keeps the output signal at logic high, otherwise it will keep the output signal at logic low. This process is repeated and with appropriate parameters i & j, different clock rates with the desired duty cycle can be generated. Exemplary counter implementation in VERILOG is shown below.

```
*******************************DESCRIPTION********************************
This module is down counter that generates a clock with specific clock rate and duty cycle using
the input clock and parameters
Inputs:
    clk : high speed input clock
    reset : input reset signal
    val1 : 5 bit input, number of clk cycles that output clock will be high
    val2 : 5 bit input, number of clk cycles that output clock will be low
        : val1 & val2 will generate the desired duty cycle and clock rate
Outputs:
    clk_out : output clock at the desired clock rate and duty cycle
*******************************Code*************************************/
'timescale 1ns/100 ps
module downcntr (clk_out, clk, reset, val1, val2);
//{
output clk_out;
input    clk, reset, val1, val2;
//
wire [4:0] val1, val2;
wire    clk_out;
// local register
reg [4:0] count1;
//
// generate 64 KHz from 4 MHz clock
always @(posedge clk or posedge reset)
begin //{
    if (reset)              count1 <= val2-1;
    else if (count1 ==0) count1 <= val2-1;
    else                    count1 <= count1 -1;
end//}
assign clk_out = (count1 <=(val1-1));
//} end of the module endmodule
*******************************DESCRIPTION********************************
This module is a testbench to test down the counter that generates a clock with specific clock
rate and duty cycle using the input clock and parameters.
Modules instantiated:
            downcntr
*******************************Code*************************************/
'timescale 1ns/100 ps
module tdowncntr;
//{ begin the module
parameter CLOCK = 41.6667; // This is for 24 MHz clock
```

-continued

```
// parameter CLOCK = 250; // This is for 4 Mhz clock
reg clk, rst;
wire clk_o;
reg [4:0] val1, val2;
downcntr clk_gen(
.clk_out (clk_0),      // output, clock
.clk (clk),            //input, high speed clock
.reset (rst),     // input
.val1 (val1),     // input
.val2 (val2)      // input
);
initial // Clock generator
    begin
            clk = 0;
            #80 forever #(CLOCK/2) clk = !clk;
    end
// These two parameters are set for generating 1 MHz clock from a 24 MHz clock with
// duty cycle (1/3)/(2/3) (1/3 microsecond clock will be high, and 2/3 microsecond
// clock will be low
initial //set the parameters
    begin
            val1 = 5'd08;
            val2 = 5'd24;
    end
//
initial         // Test stimulus
    begin
            rst = 0;
            #450 rst = 1;
            #400 rst = 0;
            #50000 $stop;
    end
initial
            $monitor($stime,, rst,, clk,,,clk_o);
//} end of module
endmodule
```

Figure 3:
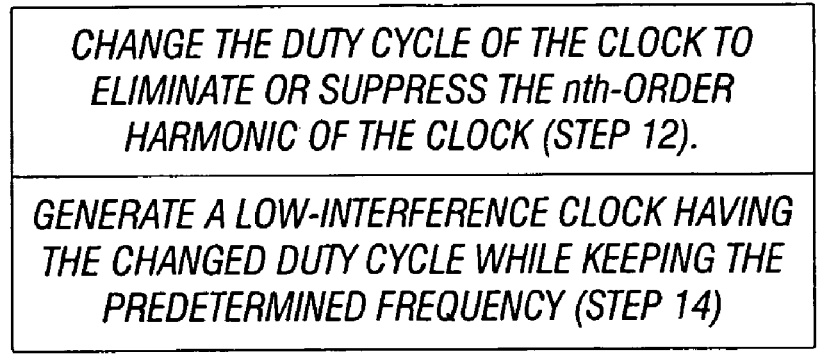
FIG. 3 shows an exemplary process for generating clock signals with minimal interference.

FIG. 3 shows an exemplary process that minimizes or eliminates nth-order harmonic, particularly nth-order harmonic associated with a square wave clock signal having a predetermined frequency and a duty cycle. The process includes changing the duty cycle of the clock to eliminate or suppress the nth-order harmonic of that clock (step 12). Next, a low-interference clock having the changed duty cycle while keeping the predetermined frequency is generated (step 14). The low-interference clock can be an asymmetrical clock signal. Since the square wave clock has rising and falling edges, the changing of the duty cycle changes the position of the falling edge of the square wave clock with respect to the position of the rising edge of the clock.

Figure 6:
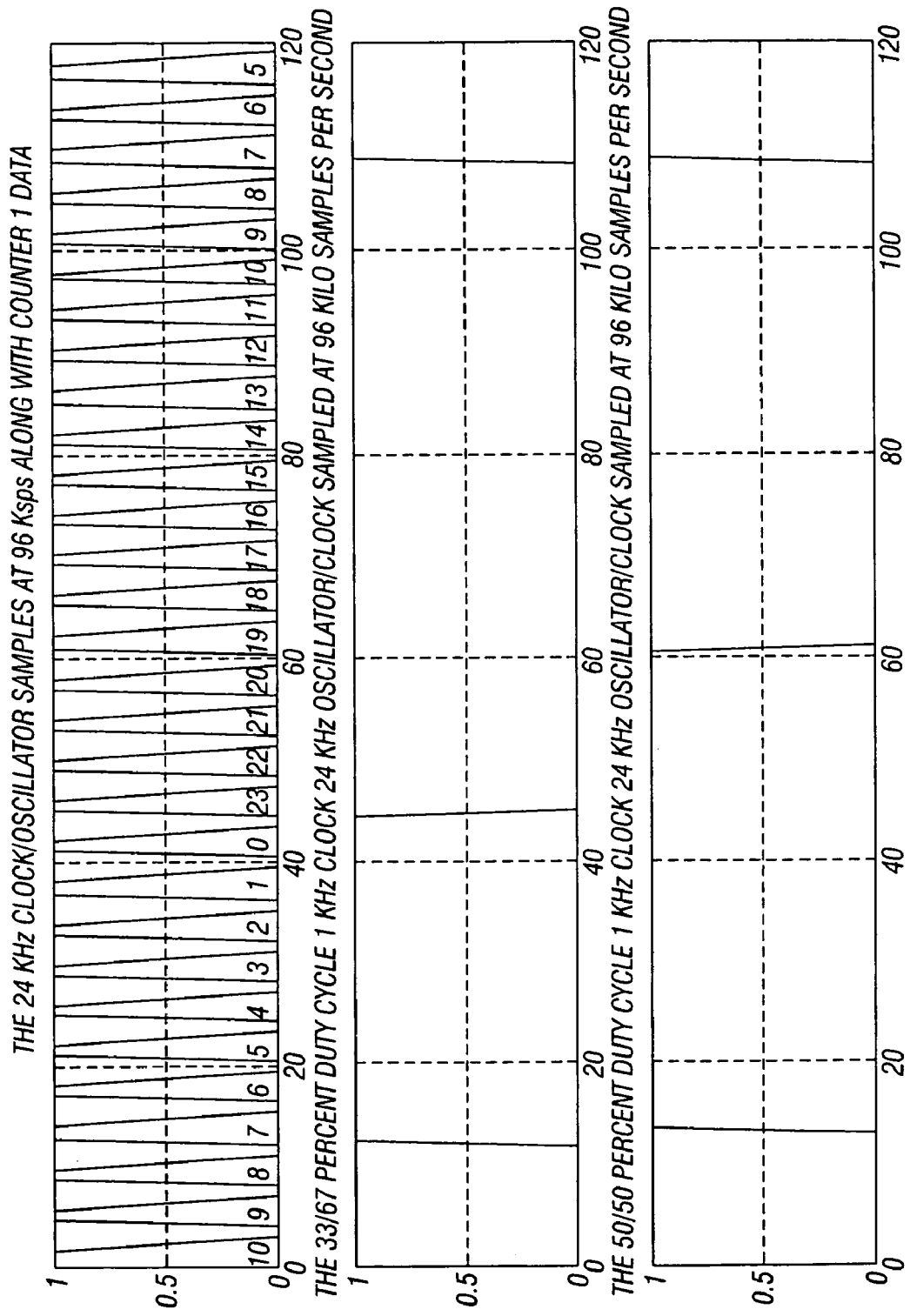
FIG. 6 shows a time domain analysis of a 24 KHz clock along with the 1 KHz clock with two different duty cycles.

Next, a simulation of an exemplary system for removing the third harmonic of the 1 MHz clock on a digital IC is detailed. The system can be applied for suppressing any arbitrary harmonic by choosing the appropriate parameters. Code for performing the simulation in Matlab is shown in the Appendix and pictures of the signal spectrums at 1, 2, 3 KHz are shown in FIGS. 4–5. FIGS. 4 and 5 show the spectrum for both cases for τ=T/2, and T/3. In FIGS. 4–5, the magnitude of the 3 KHz signal is the magnitude of third harmonic signal. The frequency is scaled from 1 MHz to 1 KHz to reduce the sampling rate. FIG. 6 shows a time domain analysis of the 24 KHz clock along with the 1 KHz clock with two different duty cycles.

Viewing FIGS. 4–6 in combination, changing the duty cycle of a square wave signal will eliminate or suppress different harmonics of that signal on a digital IC. Certain considerations in designing the digital IC and using this method to eliminate or suppress the harmonics for any clock signal on the chip include:

1) Changing the clock duty cycle will change the position of the falling edge of the clock respect to the position of the rising edge of the clock. Thus, if both edges of the clock are used, the change in positions of the edges needs to be considered in the design.

2) Eliminating one harmonic will change the magnitude of the other harmonic. In the example, from the spectrum of the signal, a symmetric clock does not have any second harmonic, but the modified clock with no third harmonic has a significant second harmonic.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. An apparatus comprising:
   an oscillator configured to generate a first clock signal having a first duty cycle;
   a counter coupled to the oscillator and configured to count between a first number and a second number; and
   a controller coupled to the counter and configured to generate a second clock signal from the first clock signal, the second clock signal having a second duty cycle different than the first duty cycle, wherein the controller is configured to generate the second duty cycle based on an output of the counter, the second clock signal to reduce harmonic interference in an intermediate frequency signal in a wireless transceiver.

2. The apparatus of claim 1, wherein the first duty cycle comprises a symmetric duty cycle and the second duty cycle comprises an asymmetric duty cycle.

3. The apparatus of claim 1, wherein the controller is configured to receive a first count value and a second count value.

4. The apparatus of claim 3, wherein the controller is configured to trigger an edge of the second clock signal when the output of the counter corresponds to the first count value.

5. The apparatus of claim 1, wherein the first clock signal and the second clock signal have the same frequency.

6. The apparatus of claim 1, wherein the controller is configured to reset the counter to the first number upon initialization.

7. The apparatus of claim 1, wherein the controller is configured to provide the second clock signal to the wireless transceiver.

8. The apparatus of claim 1, wherein the counter comprises a modular down counter.

9. A method comprising:
receiving a counter value from a counter configured to count between a predetermined number range;
comparing the counter value to a first count threshold; and
generating an output clock signal from an input clock signal based on the comparison, wherein the output clock signal has a duty cycle different than the input clock signal.

10. The method of claim 9, further comprising receiving the input clock signal with a symmetric duty cycle and generating the output clock signal with an asymmetric duty cycle.

11. The method of claim 9, further comprising generating the output clock signal with a first value if the counter value is above the first count threshold and with a second value if the counter value is below the first count threshold.

12. The method of claim 9, wherein the duty cycle corresponds to a ratio between the first count threshold and the predetermined number range.

13. The method of claim 9, further comprising:
receiving the input clock signal from an oscillator; and
providing the output clock signal to digital circuitry.

14. A method comprising:
generating a first clock signal with a first duty cycle at a first frequency using an oscillator; and
generating a second clock signal at the first frequency with a second duty cycle formed by a first transition and a second transition, the second transition initiated when a value of a counter coupled to the oscillator is at a predetermined value.

15. The method of claim 14, further comprising generating the first clock signal at an intermediate frequency.

16. The method of claim 14, further comprising providing the second clock signal to a digital portion of an integrated circuit comprising a transceiver.

17. The method of claim 16, further comprising generating the first clock signal via the oscillator, wherein the oscillator and the digital portion are located on a single substrate of the integrated circuit.

18. The method of claim 14, further comprising receiving a first count value and a second count value to set the second duty cycle.

19. The method of claim 14, further comprising generating the first clock signal with a symmetric duty cycle and generating the second clock signal with an asymmetric duty cycle.

* * * * *